US012563812B2

(12) United States Patent
Song et al.

(10) Patent No.: US 12,563,812 B2
(45) Date of Patent: Feb. 24, 2026

(54) COMPOSITE GATE DIELECTRIC FOR HIGH-VOLTAGE DEVICE

(71) Applicant: Taiwan Semiconductor Manufacturing Company, Ltd., Hsinchu (TW)

(72) Inventors: Jhu-Min Song, Nantou (TW); Ying-Chou Chen, Taichung (TW); Yi-Kai Ciou, Taoyuan (TW); Chien-Chih Chou, New Taipei (TW); Fei-Yun Chen, Hsinchu (TW); Yu-Chang Jong, Hsinchu (TW); Chi-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 481 days.

(21) Appl. No.: 18/150,266

(22) Filed: Jan. 5, 2023

(65) Prior Publication Data

US 2024/0113187 A1 Apr. 4, 2024

Related U.S. Application Data

(60) Provisional application No. 63/412,954, filed on Oct. 4, 2022.

(51) Int. Cl.
| | |
|---|---|
| *H10D 64/27* | (2025.01) |
| *H10D 84/01* | (2025.01) |
| *H10D 84/03* | (2025.01) |
| *H10D 84/83* | (2025.01) |
| *H10D 30/60* | (2025.01) |

(52) U.S. Cl.
CPC ....... *H10D 64/516* (2025.01); *H10D 84/0144* (2025.01); *H10D 84/0158* (2025.01); *H10D 84/038* (2025.01); *H10D 84/834* (2025.01); *H10D 30/60* (2025.01)

(58) Field of Classification Search
CPC ........... H10D 84/0142; H10D 84/0144; H10D 64/027; H10D 64/516
See application file for complete search history.

(56) References Cited

U.S. PATENT DOCUMENTS

| | | | | |
|---|---|---|---|---|
| 9,379,186 B1 * | 6/2016 | Wang | .................... | H10D 64/513 |
| 9,589,846 B1 | 3/2017 | Tsai et al. | | |
| 9,589,960 B1 * | 3/2017 | Min | .................... | H10D 30/0221 |
| 2004/0152271 A1 * | 8/2004 | Wu | ........................ | H10D 30/668 |
| | | | | 257/E21.546 |

(Continued)

*Primary Examiner* — Tuan A Hoang
(74) *Attorney, Agent, or Firm* — Eschweiler & Potashnik, LLC

(57) ABSTRACT

The present disclosure relates to an integrated chip. The integrated chip includes a substrate having one or more interior surfaces forming a recess within an upper surface of the substrate. Source/drain regions are disposed within the substrate on opposing sides of the recess. A first gate dielectric is arranged along the one or more interior surfaces forming the recess, and a second gate dielectric is arranged on the first gate dielectric and within the recess. A gate electrode is disposed on the second gate dielectric. The second gate dielectric includes one or more protrusions that extend outward from a recessed upper surface of the second gate dielectric and that are arranged along opposing sides of the second gate dielectric.

20 Claims, 14 Drawing Sheets

(56) References Cited

U.S. PATENT DOCUMENTS

| | | | |
|---|---|---|---|
| 2008/0079038 A1* | 4/2008 | Kim | H10D 84/0151 |
| | | | 257/E21.628 |
| 2010/0140687 A1 | 6/2010 | Chu et al. | |
| 2017/0025533 A1 | 1/2017 | Phoa et al. | |
| 2021/0119014 A1 | 4/2021 | Hsiao et al. | |
| 2021/0249534 A1* | 8/2021 | Neumann | H10D 64/112 |
| 2023/0326998 A1 | 10/2023 | Cai et al. | |

* cited by examiner

100

200

600 ⬎

102

402        404

700 ⬎

704

702       702

706

412a

102

411

402       404

800

900

1000

1100

1200

1300

1400

1404

1402
1302
1202
1006

106

102

402          404

1500

1402                    1502

1302
1202
1006

106

102

402          404

1800

1900

2200

2300

2400

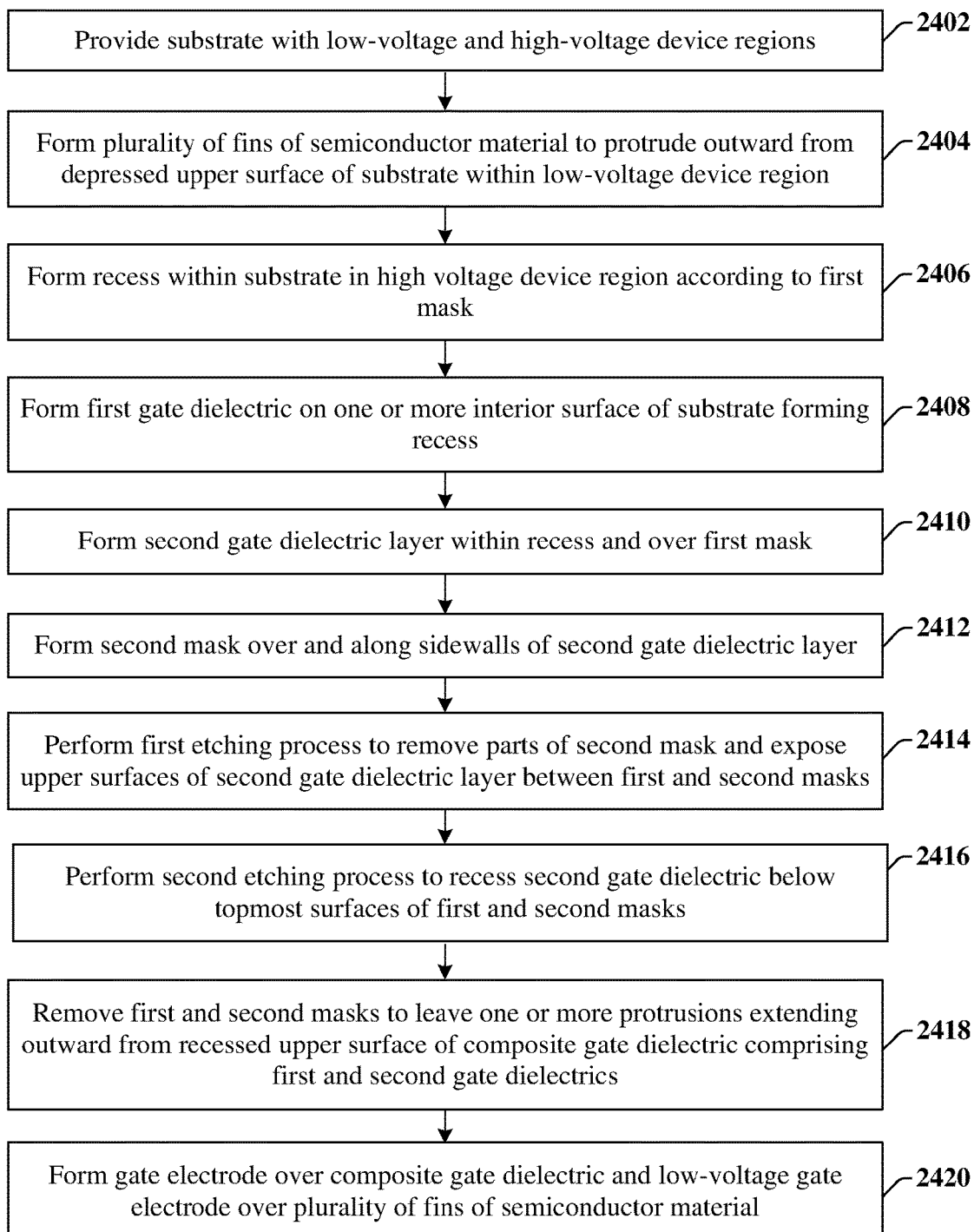

Provide substrate with low-voltage and high-voltage device regions — 2402

Form plurality of fins of semiconductor material to protrude outward from depressed upper surface of substrate within low-voltage device region — 2404

Form recess within substrate in high voltage device region according to first mask — 2406

Form first gate dielectric on one or more interior surface of substrate forming recess — 2408

Form second gate dielectric layer within recess and over first mask — 2410

Form second mask over and along sidewalls of second gate dielectric layer — 2412

Perform first etching process to remove parts of second mask and expose upper surfaces of second gate dielectric layer between first and second masks — 2414

Perform second etching process to recess second gate dielectric below topmost surfaces of first and second masks — 2416

Remove first and second masks to leave one or more protrusions extending outward from recessed upper surface of composite gate dielectric comprising first and second gate dielectrics — 2418

Form gate electrode over composite gate dielectric and low-voltage gate electrode over plurality of fins of semiconductor material — 2420

Fig. 24

COMPOSITE GATE DIELECTRIC FOR HIGH-VOLTAGE DEVICE

REFERENCE TO RELATED APPLICATION

This application claims the benefit of U.S. Provisional Application No. 63/412,954, filed on Oct. 4, 2022, the contents of which are hereby incorporated by reference in their entirety.

BACKGROUND

Modern day integrated chips comprise millions or billions of transistor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high-voltage transistor devices. For example, high-voltage transistor devices are often used in power amplifiers for RF transmission/receiving chains due to their ability to handle high breakdown voltages (e.g., greater than about 50V) and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 illustrates a flow diagram of some embodiments of a method of forming an IC having a low-voltage device and a high-voltage transistor device comprising a composite gate dielectric.

DETAILED DESCRIPTION

Figure 1:
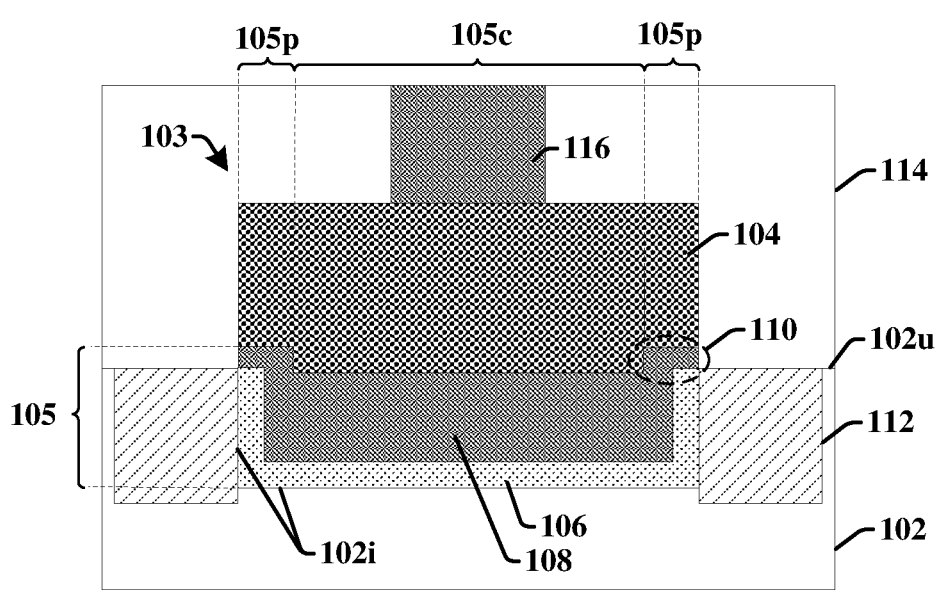
FIG. 1 illustrates a cross-sectional view of some embodiments of an integrated chip (IC) having a high-voltage transistor device comprising a composite gate dielectric.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips typically comprise transistors that are designed to operate at a number of different voltages. For example, an integrated chip may comprise high-voltage transistors designed to operate at a high breakdown voltage and low-voltage transistors designed to operate at a low breakdown voltage. A breakdown voltage of a transistor is a voltage at which a significant current (e.g., greater than or equal to approximately 250 micro-amps) starts to flow between a source region and a drain region.

When a planar high-voltage (HV) transistor device is integrated onto a same integrated chip as low-voltage (LV) FinFET devices, processing issues may arise due to differences in topology between the planar HV transistor device and the LV FinFET devices. For example, the planar HV transistor device may have a relatively thick gate dielectric that extends to a relatively large distance over a substrate. The relatively thick gate dielectric may negatively impact a planarization process used to form the LV FinFET devices and/or may negatively impact a gate electrode to metal interconnect dielectric breakdown voltage due to a thinner inter-level dielectric over the gate electrode. To avoid such problems, the gate dielectric of the planar HV device may be formed within a recess in a substrate.

Gate oxides are formed using a thermal oxidation process, since the thermal oxidation process provides for a high-quality gate oxide (e.g., a gate oxide with a high gate oxide integrity (GOI)) that is easily controlled during fabrication. However, it has been appreciated that when a gate oxide is formed within a recess in a substrate there will be less oxidation growth on recess corners, since not enough silicon atoms from the substrate can interact with an oxidizing environment. The resulting gate dielectric has a bird's beak profile that causes thinning of the gate oxide within a peripheral region of the gate oxide. The thinning of the gate oxide can lead to a lower-than-expected breakdown voltage and/or reliability problems in a resulting high voltage transistor device.

The present disclosure relates to an integrated chip having a transistor device with a composite gate dielectric comprising one or more protrusions that are configured to mitigate thinning of the composite gate dielectric. In some embodiments, the integrated chip includes a substrate having one or more interior surfaces forming a recess within an upper surface of the substrate. Source/drain regions are disposed within the substrate on opposing sides of the recess. A composite gate dielectric is arranged within the recess. The composite gate dielectric comprises a first gate dielectric arranged along the one or more interior surfaces of the substrate, and a second gate dielectric arranged on the first gate dielectric and within the recess. A gate electrode is disposed on the composite gate dielectric. The second gate dielectric comprises one or more protrusions that extend outward from an upper surface of the second gate dielectric and that are arranged within one or more peripheral regions of the second gate dielectric. The one or more protrusions cause the composite gate dielectric to be thicker within the one or more peripheral regions, thereby avoiding thinning that can lead to a lower-than-expected breakdown voltage and/or reliability problems in a resulting transistor device.

FIG. 1 illustrates a cross-sectional view of some embodiments of an integrated chip 100 having a high-voltage transistor device comprising a composite gate dielectric.

The integrated chip 100 comprises a high-voltage transistor device 103 disposed on and/or within a substrate 102. The high-voltage transistor device 103 comprises a gate electrode 104 separated from the substrate 102 by a composite gate dielectric 105. The substrate 102 has one or more interior surfaces 102*i* that form a recess within an upper surface 102*u* of the substrate 102. In some embodiments, the one or more interior surfaces 102*i* comprise one or more sidewalls and a recessed upper surface of the substrate 102. The composite gate dielectric 105 is arranged within the recess. The composite gate dielectric 105 comprises a first gate dielectric 106 and a second gate dielectric 108 over the first gate dielectric 106. The first gate dielectric 106 is arranged along the one or more interior surfaces 102*i* that form the recess. The second gate dielectric 108 is arranged on the first gate dielectric 106 and within the recess. In some embodiments, the second gate dielectric 108 extends along one or more sidewalls and a recessed upper surface of the first gate dielectric 106.

The gate electrode 104 is disposed on the composite gate dielectric 105. Source/drain regions 112 are disposed within the substrate 102 on opposing sides of the gate electrode 104. A dielectric structure 114 is arranged on the substrate 102 and surrounds the gate electrode 104. An interconnect 116 extends through the dielectric structure 114 to contact the gate electrode 104. During operation, a bias voltage may be selectively applied to the gate electrode 104. The bias voltage causes an electric field to form a conductive channel region within the substrate 102 and between the source/drain regions 112.

The composite gate dielectric 105 comprises a central region 105*c* and one or more peripheral regions 105*p* surrounding the central region 105*c*. Within the one or more peripheral regions 105*p*, the second gate dielectric 108 comprises one or more protrusions 110 that extend outward from an upper surface of the second gate dielectric 108. In some embodiments, the one or more protrusions 110 may be arranged along opposing outermost sides of the second gate dielectric 108. The one or more protrusions 110 cause the composite gate dielectric 105 to be thicker within the one or more peripheral regions 105*p* of the composite gate dielectric 105, thereby avoiding corner thinning that can lead to lower-than-expected breakdown voltage and/or reliability problems in the high-voltage transistor device 103.

Figure 2:
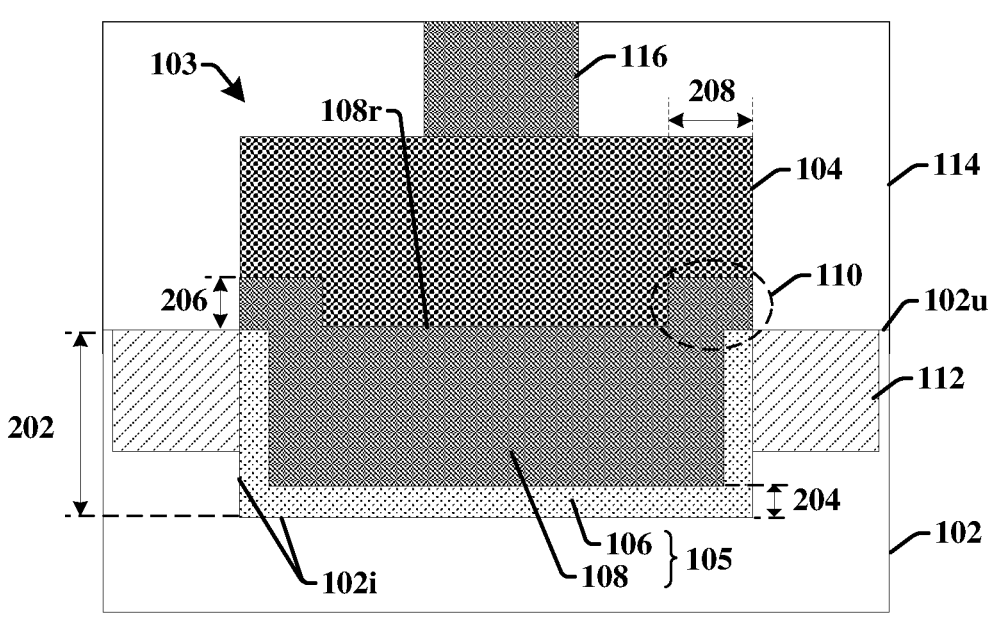
FIG. 2 illustrates a cross-sectional view of some additional embodiments of an IC having a high-voltage transistor device comprising a composite gate dielectric.

FIG. 2 illustrates a cross-sectional view of some additional embodiments of an integrated chip 200 having a high-voltage transistor device comprising a composite gate dielectric.

The high-voltage transistor device 103 is disposed on a substrate 102. The substrate 102 has one or more interior surfaces 102*i* that form a recess within an upper surface 102*u* of the substrate 102. The high-voltage transistor device 103 comprises a gate electrode 104 separated from the substrate 102 by a composite gate dielectric 105 arranged within the recess. The composite gate dielectric 105 comprises a first gate dielectric 106 and a second gate dielectric 108 over the first gate dielectric 106.

The first gate dielectric 106 is arranged along the one or more interior surfaces 102*i* of the substrate 102 that form the recess. The second gate dielectric 108 is arranged on the first gate dielectric 106 and within the recess. In some embodiments, the first gate dielectric 106 has a recess within a topmost surface of the first gate dielectric 106. In some such embodiments, the second gate dielectric 108 extends along one or more interior sidewalls and a recessed upper surface of the first gate dielectric 106. The second gate dielectric 108 covers the topmost surface of the first gate dielectric 106. The second gate dielectric 108 comprises one or more protrusions 110 that extend outward from a recessed upper surface 108*r* of the second gate dielectric 108. The one or more protrusions 110 are formed by an interior sidewall of the second gate dielectric 108 that is directly over the second gate dielectric 108. The interior sidewall of the second gate dielectric 108 is coupled between a topmost surface of the second gate dielectric 108 and the recessed upper surface 108*r*. The topmost surface of the second gate dielectric 108 laterally extends from directly over the topmost surface of the first gate dielectric 106 to directly over the recessed upper surface of the first gate dielectric 106.

In some embodiments, the first gate dielectric 106 is a thermal oxide and the second gate dielectric 108 is a high temperature oxide. The thermal oxide provides the composite gate dielectric 105 with a good integrity, while the high temperature oxide allows for the formation of the one or more protrusions 110 to increase a thickness of the composite gate dielectric 105 and avoid unwanted thinning.

In some embodiments, the recess within the substrate 102 may have a depth 202 that is in a range of between approximately 10 nanometers (nm) and approximately 100 nm, between approximately 10 nm and approximately 50 nm, between approximately 13 nm and approximately 15 nm, or other similar values. It will be appreciated that the depth 202 of the recess is correlated to a breakdown voltage of the high-voltage transistor device 103. For example, a recess having a first depth will provide for a larger breakdown voltage than a recess having a second depth that is smaller than the first depth. In some embodiments, the first gate dielectric 106 may have a thickness 204 that is in a range of between approximately 100 Angstroms (Å) and approximately 200 Å, between approximately 130 Å and approximately 150 Å, or other similar values.

The one or more protrusions 110 extend to a first height 206 over the topmost surface of the first gate dielectric 106. In some embodiments, the first height 206 may be in a range of between approximately 2 nm and approximately 10 nm, between approximately 4 nm and approximately 6 nm, or other similar values. In some embodiments, the one or more protrusions 110 may have a width 208 that is in a range of between approximately 2 nm and approximately 20 nm, between approximately 3 nm and approximately 12 nm, between approximately 4 nm and approximately 8 nm, or other similar values. The second gate dielectric 108 has a topmost surface that is arranged along outermost sidewalls of the second gate dielectric 108. The second gate dielectric 108 has a maximum thickness at a location that is laterally between an outermost sidewall of the second gate dielectric 108 and the interior sidewall of the second gate dielectric 108 that faces the gate electrode 104.

In some embodiments, the recessed upper surface 108r of the second gate dielectric 108 may be substantially co-planar with the upper surface 102u of the substrate 102. In other embodiments, the recessed upper surface 108r of the second gate dielectric 108 may be vertically offset (e.g., above or below) from the upper surface 102u of the substrate 102. In some embodiments, the recessed upper surface 108r of the second gate dielectric 108 may be vertically above the upper surface 102u of the substrate 102, so that the second gate dielectric 108 fills a remainder of the recess within the substrate 102, which is not filled by the first gate dielectric 106. In some embodiments, an imaginary horizontal line that is parallel to the upper surface 102u of the substrate 102 may extend through the interior sidewall of the second gate dielectric 108 and sidewalls of the gate electrode 104.

Figure 3:
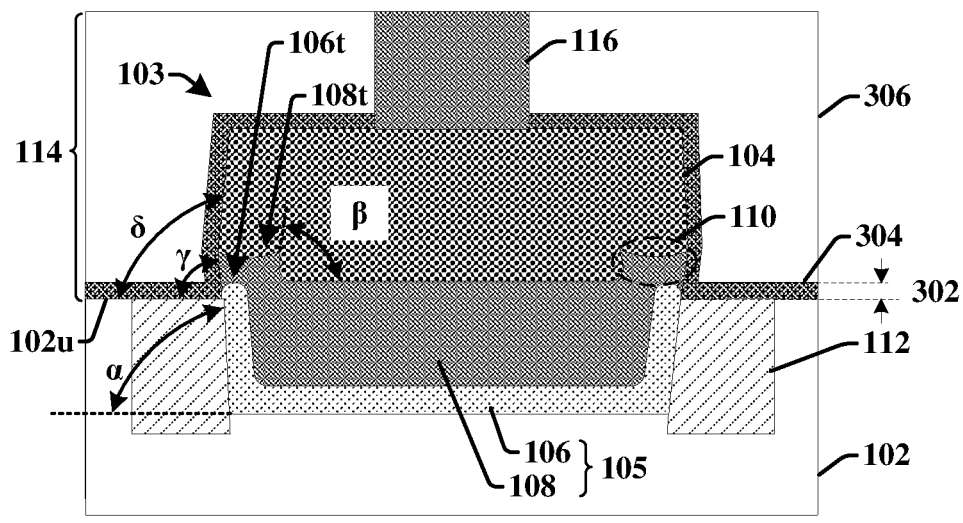
FIG. 3 illustrates a cross-sectional view of some additional embodiments of an IC having a high-voltage transistor device comprising a composite gate dielectric.

FIG. 3 illustrates a cross-sectional view of some additional embodiments of an integrated chip 300 having a high-voltage transistor device comprising a composite gate dielectric.

The high-voltage transistor device 103 is disposed on a substrate 102 including one or more interior surfaces 102i that form a recess within an upper surface 102u of the substrate 102. The high-voltage transistor device 103 comprises a gate electrode 104 separated from the substrate 102 by a composite gate dielectric 105 arranged within the recess. The composite gate dielectric 105 comprises a first gate dielectric 106 and a second gate dielectric 108 over the first gate dielectric 106. In some embodiments, the first gate dielectric 106 may protrude to a non-zero distance 302 above the upper surface 102u of the substrate 102. In some embodiments, the first gate dielectric 106 may have one or more rounded corners. For example, the first gate dielectric 106 may have a topmost surface 106t that is rounded and/or is coupled to one or more rounded corners.

In some embodiments, the recess may be formed by angled sidewalls of the substrate 102. The angled sidewalls of the substrate 102 give the recess a tapered profile having a width that decreases as a depth into the substrate 102 increases. In some embodiments, the tapered sidewalls of the substrate 102 may be oriented at an angle α measured with respect to a horizontal line (e.g., a line that is parallel to the upper surface 102u of the substrate 102). In some embodiments, the angle α may be in a range of between approximately 85° and approximately 90°, between approximately 88° and approximately 90°, or other similar values. In some embodiments, the first gate dielectric 106 may also have angled outer sidewalls that give the first gate dielectric 106 a tapered profile. In some embodiments, the tapered sidewalls of the first gate dielectric 106 may be oriented at the angle α measured with respect to the horizontal line.

The second gate dielectric 108 comprises one or more protrusions 110 that extend outward from a recessed upper surface of the second gate dielectric 108. The one or more protrusions 110 are formed by one or more interior sidewalls and one or more outermost sidewalls of the second gate dielectric 108. In some embodiments, the one or more interior sidewalls of the second gate dielectric 108 may be oriented at an angle β measured with respect to a horizontal line. In some embodiments, the angle β may be in a range of between approximately 85° and approximately 90°, between approximately 88° and approximately 90°, or other similar values. In some embodiments, the one or more outermost sidewalls of the second gate dielectric 108 may be oriented at an angle α measured with respect to a horizontal line. In some embodiments, the angle α may be in a range of between approximately 85° and approximately 90°, between approximately 88° and approximately 90°, or other similar values.

In some embodiments, the second gate dielectric 108 may have a topmost surface 108t facing away from the substrate 102. In some embodiments, the topmost surface may have a rounded profile (e.g., a concavity). In such embodiments, the gate electrode 104 may extend to within the concavity in the rounded topmost surface. In some embodiments, the one or more protrusions 110 may be substantially symmetric about a line bisecting the topmost surface 108t. In other embodiments, the one or more protrusions 110 may be asymmetric about a line bisecting the topmost surface 108t.

In some embodiments, the gate electrode 104 may have angled sidewalls that give the gate electrode 104 a tapered profile that decreases in width as a height of the gate electrode 104 increases. In some embodiments, the tapered sidewalls of the substrate 102 may be oriented at an angle δ measured with respect to a horizontal line. In some embodiments, the angle δ may be in a range of between approximately 90° and approximately 95°, between approximately 90° and approximately 92°, or other similar values.

A dielectric structure 114 is arranged over the substrate 102. In some embodiments, the dielectric structure 114 may comprise a contact etch stop layer (CESL) 304 and an inter-level dielectric (ILD) layer 306 over the CESL 304. In some embodiments, the ILD layer 306 may comprise one or more of silicon dioxide, carbon doped silicon oxide (Si-COH), phosphosilicate glass (PSG), borophosphosilicate glass (BPSG), borosilicate glass (BSG), fluorosilicate glass (FSG), undoped silicate glass (USG), or the like. In some embodiments, the CESL 304 may comprise silicon nitride, silicon carbide, silicon nitride carbide, aluminum nitride, a metal oxide (such as aluminum oxide, titanium oxide, tantalum oxide, etc.), or the like. An interconnect 116 extends through the dielectric structure 114 to contact the gate electrode 104. In some embodiments, the interconnect 116 may comprise conductive contacts, interconnect wires, and/or interconnect vias including one or more of copper, aluminum, tungsten, ruthenium, or the like.

Figure 4A:
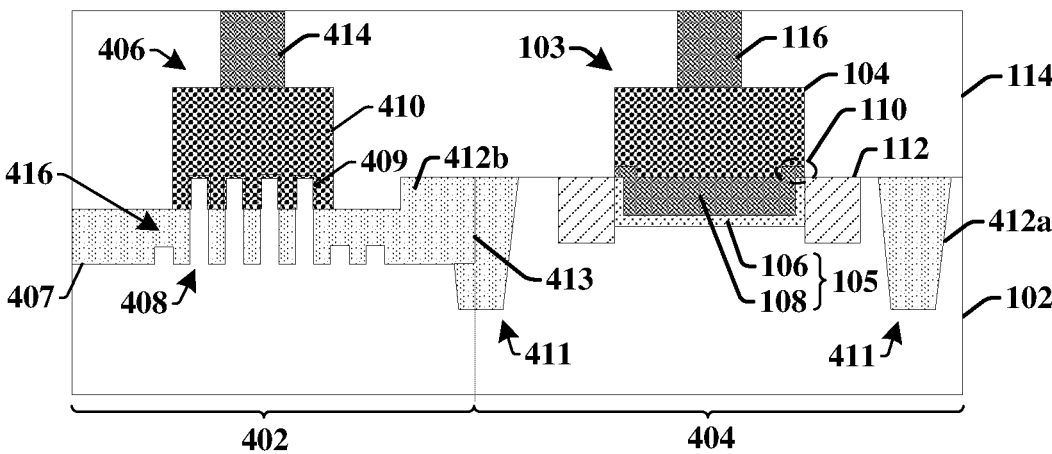
FIG. 4A illustrates a cross-sectional view of some embodiments of an IC having a low-voltage device and a high-voltage transistor device comprising a composite gate dielectric.

FIG. 4A illustrates a cross-sectional view of some embodiments of an integrated chip 400 having a low-voltage device and a high-voltage transistor device comprising a composite gate dielectric.

The integrated chip 400 comprises a substrate 102 having a low-voltage device region 402 and a high-voltage device region 404. A low-voltage transistor device 406 is disposed within the low-voltage device region 402 and a high-voltage transistor device 103 is disposed within the high-voltage device region 404. The high-voltage transistor device 103 comprises a gate electrode 104 separated from the substrate 102 by a composite gate dielectric 105 arranged on the substrate 102 and within the recess. The composite gate dielectric 105 comprises a first gate dielectric 106 and a second gate dielectric 108 over the first gate dielectric 106.

In some embodiments, one or more isolation structures 411 may be disposed within the substrate 102. The one or more isolation structures 411 comprise one or more first dielectric materials 412a disposed within one or more trenches extending into the substrate 102. The one or more isolation structures 411 may be disposed within the high-voltage device region 404 and/or between the low-voltage device region 402 and the high-voltage device region 404.

In some embodiments, the low-voltage transistor device 406 may comprise a FinFET device. In such embodiments, one or more fins of semiconductor material 408 protrude outward from a depressed upper surface 407 of the substrate 102. One or more second dielectric materials 412b laterally surround the one or more fins of semiconductor material 408. The one or more fins of semiconductor material 408 protrude outward from an upper surface of the one or more second dielectric materials 412b. In some embodiments, the one or more second dielectric materials 412b may comprise an oxide (e.g., silicon oxide, silicon dioxide, etc.), a nitride (e.g., silicon nitride, silicon oxynitride, etc.), a carbide, and/or the like. In some embodiments, the one or more first dielectric materials 412a may contact the one or more second dielectric materials 412b along an interface 413 that is over the one or more isolation structures 411. In some embodiments, the one or more first dielectric materials 412a may comprise a same dielectric material as the one or more second dielectric materials 412b, while in other embodiments the one or more first dielectric materials 412a may comprise a different dielectric material than the one or more second dielectric materials 412b.

A low-voltage gate electrode 410 is arranged over the one or more second dielectric materials 412b and the one or more fins of semiconductor material 408. The low-voltage gate electrode 410 is separated from the one or more fins of semiconductor material 408 by a low-voltage gate dielectric 409 (e.g., silicon oxide, silicon dioxide, etc.). The low-voltage gate electrode 410 wraps around the one or more fins of semiconductor material 408.

In some embodiments, one or more partial fins of semiconductor material 416 may also extend outward from the depressed upper surface 407 of the substrate 102 within the low-voltage device region 402. The one or more partial fins of semiconductor material 416 may extend outward from the depressed upper surface 407 to a lesser height than the one or more fins of semiconductor material 408. In some embodiments, the one or more second dielectric materials 412b completely cover the one or more partial fins of semiconductor material 416.

A dielectric structure 114 is arranged over the substrate 102. The dielectric structure 114 surrounds an interconnect 116 that contacts the gate electrode 104. An additional interconnect 414 is arranged within the dielectric structure 114 and contacts the low-voltage gate electrode 410.

Figure 4B:
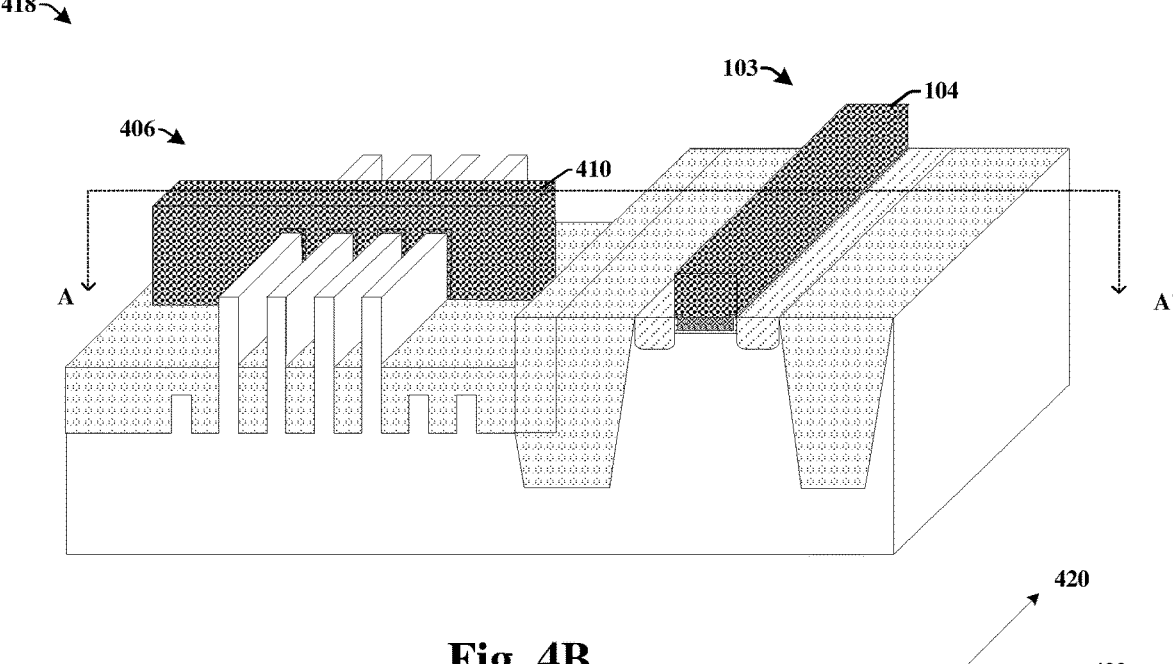
FIG. 4B illustrates a three-dimensional view of some embodiments of an IC having a low-voltage device and a high-voltage transistor device comprising a composite gate dielectric.

FIG. 4B illustrates some embodiments of a three-dimensional view 418 of the integrated chip of FIG. 4A. The cross-sectional view of FIG. 4A is taken along cross-sectional line A-A' of FIG. 4B. In some embodiments, the gate electrode 104 extends along a long axis extending in a first direction 420 and the low-voltage gate electrode 410 extends along a long axis extending in a second direction 422 that is perpendicular to the first direction 420.

Figure 5:
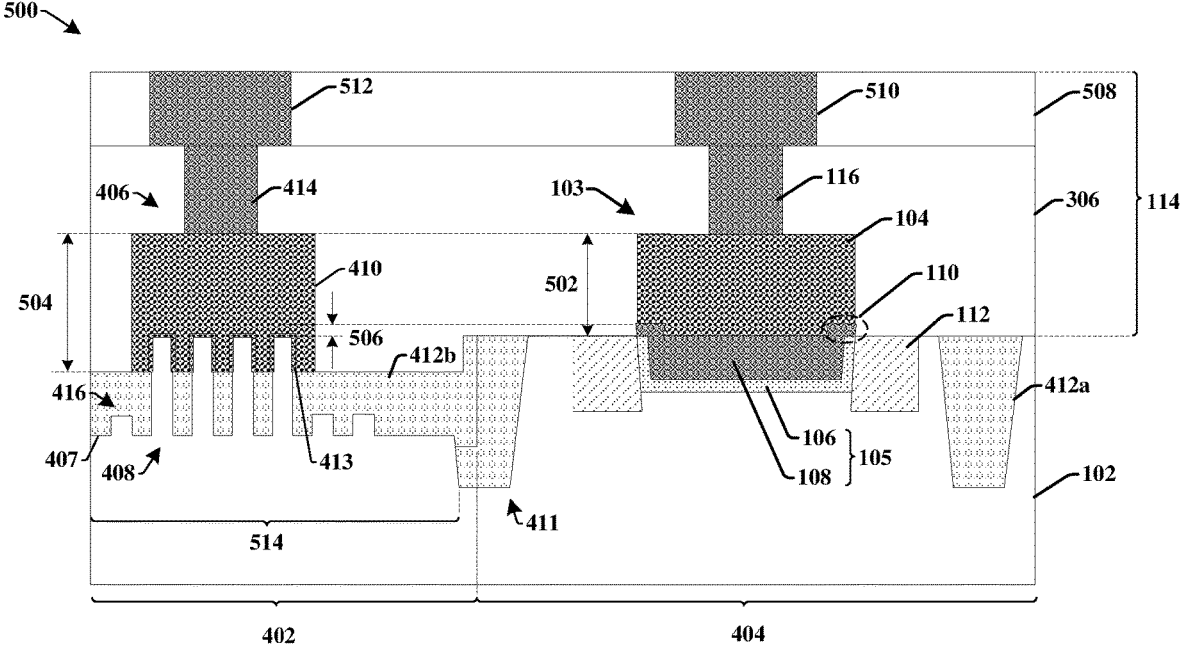
FIG. 5 illustrates a cross-sectional view of some additional embodiments of an IC having a low-voltage device and a high-voltage transistor device comprising a composite gate dielectric.

FIG. 5 illustrates a cross-sectional view of some additional embodiments of an IC having a low-voltage device and a high-voltage transistor device comprising a composite gate dielectric.

The integrated chip 500 comprises a low-voltage transistor device 406 disposed within a low-voltage device region 402 of a substrate 102 and a high-voltage transistor device 103 disposed within a high-voltage device region 404 of the substrate 102. The high-voltage transistor device 103 comprises a gate electrode 104 separated from the substrate 102 by a composite gate dielectric 105 arranged within a recess in the substrate 102. The composite gate dielectric 105 comprises a first gate dielectric 106 and a second gate dielectric 108 over the first gate dielectric 106. The low-voltage transistor device 406 comprises a FinFET device having a low-voltage gate electrode 410 that wraps around one or more fins of semiconductor material 408 that protrude outward from a depressed upper surface 407 of the substrate 102.

In some embodiments, one or more isolation structures 411 may be disposed within the substrate 102. The one or more isolation structures 411 comprise one or more first dielectric materials 412a disposed within one or more trenches extending into the substrate 102. The one or more isolation structures 411 may be disposed within the high-voltage device region 404 and/or between the low-voltage device region 402 and the high-voltage device region 404. In some embodiments, an isolation structure of the one or more isolation structures 411 that is between the low-voltage device region 402 and the high-voltage device region 404 may have a different shape than the one or more isolation structures 411 within the high-voltage device region 404. One or more second dielectric materials 412b are disposed over the substrate 102 and around the one or more fins of semiconductor material 408 within the low-voltage device region 402. The one or more isolation structures 411 may extend into the substrate 102 to a greater depth than the one or more second dielectric materials 412b so as to form a crown structure 514 protruding outward from the substrate 102. The one or more fins of semiconductor material 408 and the one or more partial fins of semiconductor material 416 may extend outward from the crown structure 514. In some embodiments, the one or more first dielectric materials 412a may contact the one or more second dielectric materials 412b along an interface 413 that is over the one or more isolation structure 411. In some embodiments, the interface 413 may extend to below the depressed upper surface 407.

The second gate dielectric 108 comprises one or more protrusions 110 extending outward from a recessed upper surface. In some embodiments, the one or more protrusions 110 may have an upper surface that is a non-zero distance 506 above a top of the one or more fins of semiconductor material 408. For example, the one or more protrusions 110 may extend to a non-zero distance 506 of between approximately 4 nm and approximately 6 nm above the tops of the one or more fins of semiconductor material 408. Because the one or more protrusions 110 are a small distance above the tops of the one or more fins of semiconductor material 408, a planarization process used to form the one or more fins of semiconductor material 408 will still not be significantly impacted by the composite gate dielectric 105. In some alternative embodiments, the one or more protrusions 110 may have an upper surface that is substantially aligned a top of the one or more fins of semiconductor material 408. Because the one or more protrusions 110 are substantially aligned with a top of the one or more fins of semiconductor material 408, a planarization process used to form the one or more fins of semiconductor material 408 will not be significantly impacted by the composite gate dielectric 105.

The gate electrode 104 extends to a first height 502 over the upper surface of the substrate 102. The low-voltage gate electrode 410 extends to a second height 504 over the substrate 102. In some embodiments, the first height 502 may be larger than the second height 504. In some embodiments, topmost surfaces of the gate electrode 104 and the low-voltage gate electrode 410 may be substantially co-planar.

A dielectric structure 114 is arranged over the substrate 102. The dielectric structure 114 comprises an ILD layer 306. In some embodiments, the ILD layer 306 is separated from the substrate 102 by a contact etch stop layer (not shown), and the ILD layer 306 is separated from the upper ILD layer 508 by an upper etch stop layer (not shown). An interconnect 116 is arranged within the ILD layer 306 and contacts the gate electrode 104. An additional interconnect 414 is arranged within the ILD layer 306 and contacts the low-voltage gate electrode 410. In some embodiments, the dielectric structure 114 may further comprise one or more additional ILD layers over the ILD layer 306. The one or more additional ILD layers may surround one or more additional interconnect layers. For example, a first upper interconnect 510 and a second upper interconnect 512 may be arranged within an upper ILD layer 508 disposed over the ILD layer 306.

It will be appreciated that the disclosed integrated chip and/or high voltage transistor device may be implemented in a wide range of applications. For example, the disclosed integrated chip and/or high voltage transistor device may be implemented within a bipolar-CMOS-DMOS (BCD), a driver integrated chip (IC), an image sensor, a power management device, an image signal process (ISP), or the like.

FIGS. 6-23 illustrate cross-sectional views 600-2300 of some embodiments of a method of forming an IC having a low-voltage device and a high-voltage transistor device comprising a composite gate dielectric. Although FIGS. 6-23 are described in relation to a method, it will be appreciated that the structures disclosed in FIGS. 6-23 are not limited to such a method, but instead may stand alone as structures independent of the method.

Figure 6:
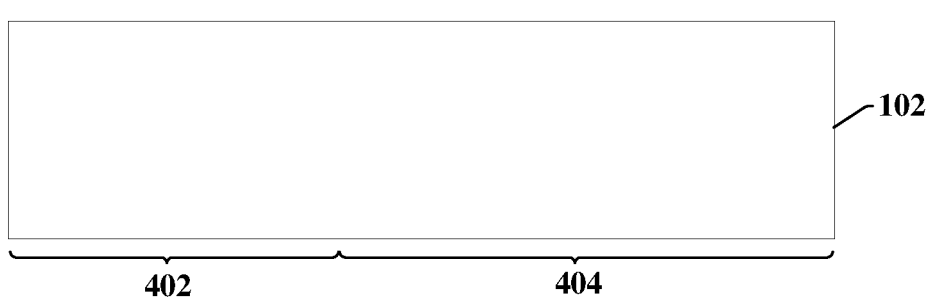
FIGS. 6-23 illustrate cross-sectional views showing some embodiments of a method of forming an IC having a low-voltage device and a high-voltage transistor device comprising a composite gate dielectric.

As shown in cross-sectional view 600 of FIG. 6, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith.

Figure 7:
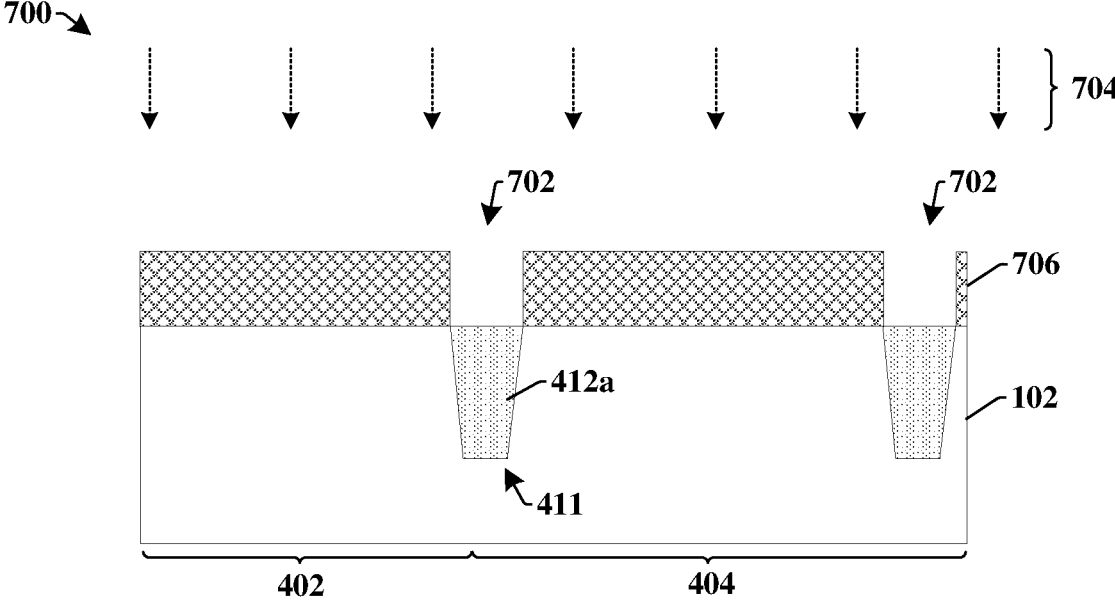

As shown in cross-sectional view 700 of FIG. 7, one or more trenches 702 may be formed within the substrate 102. The one or more trenches 702 may extend into the substrate 102 in the high-voltage device region 404. In some embodiments, one of the one or more trenches 702 may extend into the substrate 102 between the low-voltage device region 402 and the high-voltage device region 404. In some embodiments, the one or more trenches 702 may be formed by selectively exposing the substrate 102 to an etchant 704 according to a mask 706. In some embodiments, the mask 706 may comprise an oxide, a nitride, and/or photoresist.

The one or more trenches 702 are subsequently filled with one or more first dielectric materials 412a to form one or more isolation structures 411 (e.g., shallow trench isolation (STI) structures). In some embodiments, the one or more first dielectric materials 412a may comprise an oxide (e.g., silicon oxide, silicon dioxide, or the like), a nitride, and/or the like. In some embodiments, the one or more first dielectric materials 412a may be formed using a thermal process (e.g., a thermal oxidation process), a deposition process (e.g., a physical vapor deposition (PVD) process, a chemical vapor deposition (CVD) process, a plasma enhanced CVD (PE-CVD) process, a low-pressure chemical vapor deposition (LPCVD) process, an ion beam deposition, sputtering, or the like), and/or the like. After forming the one or more first dielectric materials 412a within the one or more trenches 702, a planarization process (e.g., a chemical mechanical planarization (CMP) process) may be performed to remove excess of the one or more first dielectric materials 412a from over the substrate 102.

Figure 8:
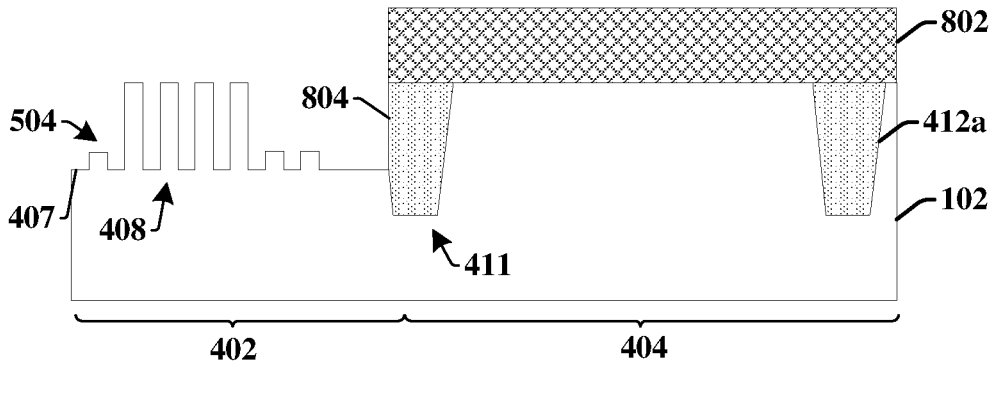

As shown in cross-sectional view 800 of FIG. 8, one or more fins of semiconductor material 408 are formed within the low-voltage device region 402. The one or more fins of semiconductor material 408 protrude outward from a depressed upper surface 407 of the substrate 102. In some embodiments, the one or more fins of semiconductor material 408 may be formed by one or more lithography and etching processes. In some embodiments, the one or more fins of semiconductor material 408 may be formed by a double patterning lithography process (e.g., a self-aligned double patterning (SADP) process). In some such embodiments, a plurality of mandrels are formed over the substrate 102. Sidewall spacers are formed on opposing sides of the plurality of mandrels, and then the plurality of mandrels are removed to leave the sidewall spacers in place. The substrate 102 is subsequently etched according to the sidewall spacers to form the one or more fins of semiconductor material 408. In some embodiments, the one or more fins of semiconductor material 408 may be formed by way of a double patterning lithography process while a mask 802 covers the high-voltage device region 404. In some embodiments, the one or more lithography and etching processes may etch away a part of an isolation structure of the one or more isolation structures 411 that is between the low-voltage device region 402 and the high-voltage device region 404, thereby giving the isolation structure a vertically extending sidewall 804 that is directly over the isolation structure.

Figure 9:
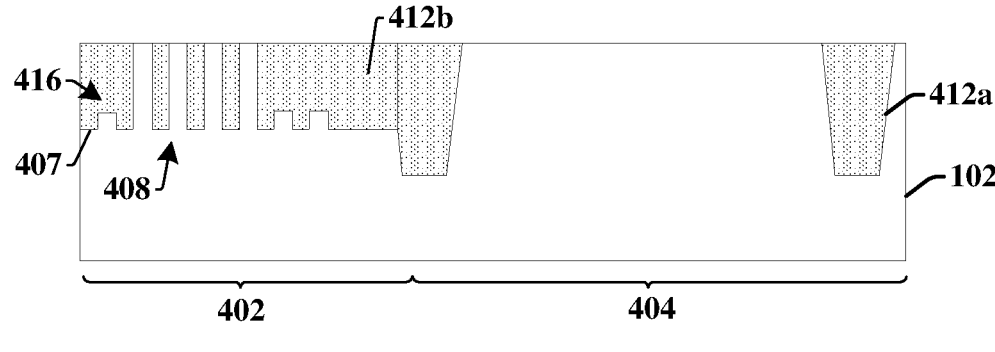

As shown in cross-sectional view 900 of FIG. 9, one or more second dielectric materials 412b are formed on the substrate 102 to surround the one or more fins of semiconductor material 408. The one or more second dielectric materials 412b may be formed along sidewalls and over topmost surfaces of the one or more fins of semiconductor material 408. In some embodiments, the one or more second dielectric materials 412b may comprise an oxide (e.g., silicon oxide, silicon dioxide, or the like), a nitride, or the like. In some embodiments, the one or more second dielectric materials 412b may be a same dielectric material as the one or more first dielectric materials 412a, while in other embodiments the one or more second dielectric materials 412b may be a different dielectric material than the one or more first dielectric materials 412a. In some embodiments, the one or more second dielectric materials 412b may be formed by way of a deposition process (e.g., a PVD process, a CVD process, a PE-CVD process, a LPCVD process, an ion beam deposition, sputtering, or the like). After forming the one or more second dielectric materials 412b over the one or more fins of semiconductor material 408, a planarization process (e.g., a CMP process) is performed to remove excess of the one or more second dielectric materials 412b from over the substrate 102.

Figure 10:
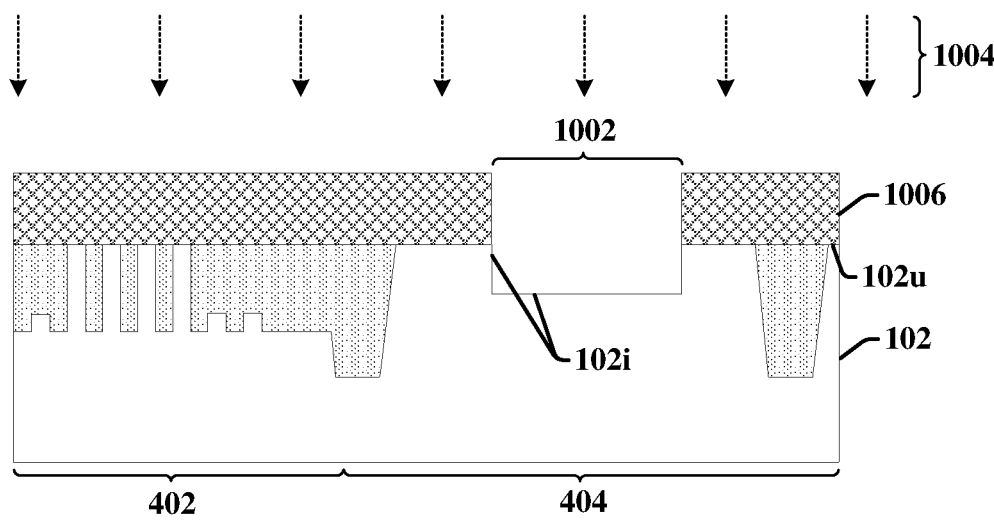

As shown in cross-sectional view 1000 of FIG. 10, a recess 1002 is formed within an upper surface 102u of the substrate 102 within the high-voltage device region 404. The recess 1002 is formed by etching the substrate 102 to form one or more interior surfaces 102i. In some embodiments, the one or more interior surfaces 102i may comprise one or more sidewalls and a recessed upper surface. In some embodiments, the recess 1002 may be formed by selectively exposing the substrate 102 to an etchant 1004 according to a first mask 1006. In various embodiments, the etchant 1004 may comprise a dry etchant (e.g., an ion beam etchant, a RIE etchant, or the like) or a wet etchant. In some embodiments, the first mask 1006 may comprise a nitride (e.g., silicon nitride, silicon oxynitride, etc.), a carbide (e.g., silicon carbide, silicon oxycarbide, etc.), or the like. In some embodiments, the first mask 1006 may be formed by a deposition process (e.g., a PVD process, a CVD process, a PE-CVD process, a LPCVD process, an ion beam deposition, sputtering, or the like).

Figure 11:
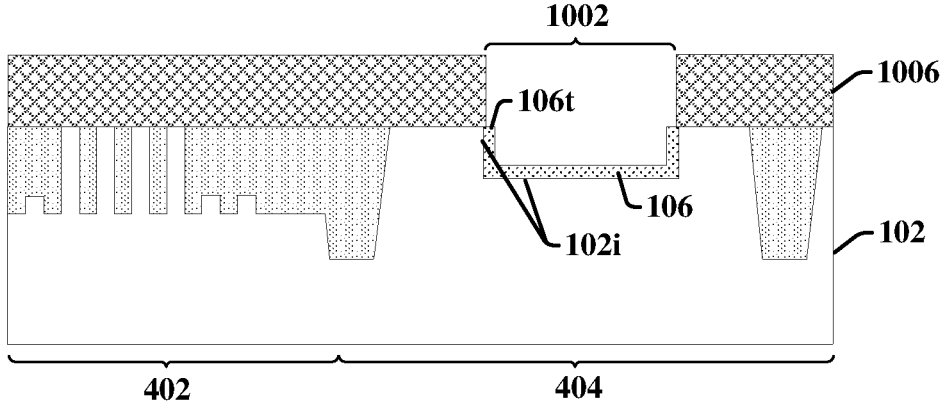

As shown in cross-sectional view 1100 of FIG. 11, a first gate dielectric 106 is formed within the recess 1002. In some embodiments, the first gate dielectric 106 is conformally formed along the one or more interior surfaces 102i of the substrate 102 that form the recess 1002. The first gate dielectric 106 may be formed to have a topmost surface 106t that is recessed below a topmost surface of the first mask 1006. In some embodiments, the first gate dielectric 106 may comprise a thermal oxide formed by a thermal oxidation process. In some such embodiments, the first gate dielectric 106 may extend to directly below the first mask 1006. In some embodiments, the topmost surface 106t of the first gate dielectric 106 may be vertically above a bottom of the first mask 1006. In some embodiments, the first gate dielectric 106 may be formed to a thickness that is in a range of between approximately 100 Å and approximately 175 Å, between approximately 130 Å and approximately 150 Å, or other similar values.

Figure 13:
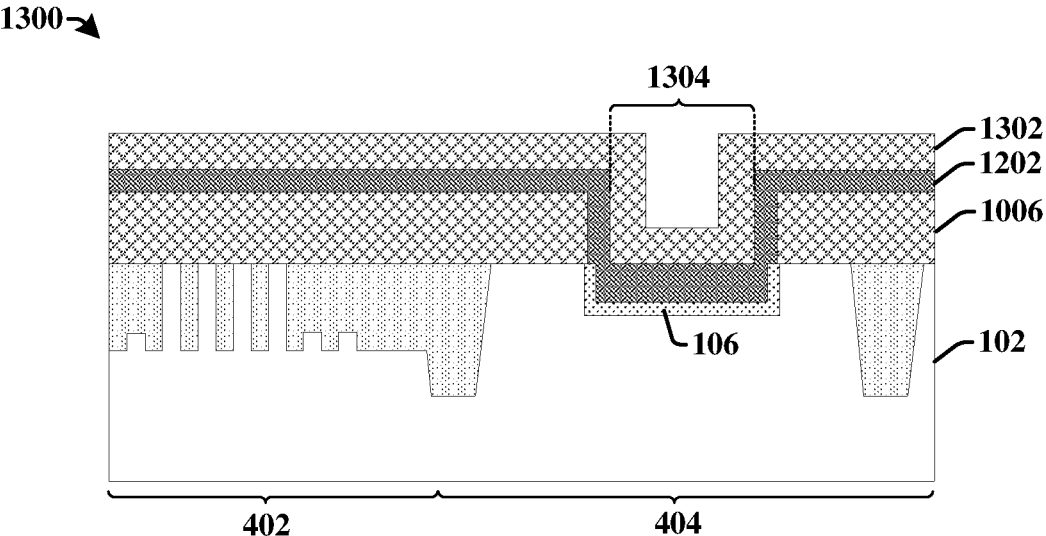

As shown in cross-sectional view 1300 of FIG. 13, a second gate dielectric layer 1202 is formed on the first gate dielectric 106 and within the recess 1002. The second gate dielectric layer 1202 is conformally formed onto sidewalls and a recessed upper surface of the first gate dielectric 106. The second gate dielectric layer 1202 may be formed to continuously extend from within the recess 1002 to over the first mask 1006. In some embodiments, the second gate dielectric layer 1202 comprises a high temperature oxide (HTO). In some embodiments, the high temperature oxide may be formed using a vapor deposition technique (e.g., a PVD process, a CVD process, a PE-CVD process, a LPCVD process, an ion beam deposition, sputtering, or the like) at an elevated temperature (e.g., greater than approximately 400° C., greater than approximately 500° C., or the like). In some embodiments, the vapor deposition technique may comprise a low-pressure chemical vapor deposition (LPCVD) performed at temperature of greater than approximately 500° C.

As shown in cross-sectional view 1300 of FIG. 13, a second mask 1302 is formed on the second gate dielectric layer 1202 and within a recess 1304 in an upper surface of the second gate dielectric layer 1202. The second mask 1302 is conformally formed onto sidewalls and a recessed upper surface of the second gate dielectric layer 1202. The second mask 1302 may be formed to continuously extend from within the recess 1304 to over the second gate dielectric layer 1202. In some embodiments, the second mask 1302 may comprise a nitride (e.g., silicon nitride, silicon oxynitride, etc.), a carbide (e.g., silicon carbide, silicon oxycarbide, etc.), or the like. In some embodiments, the second mask 1302 may comprise a same material (e.g., silicon nitride) as the first mask 1006. In some embodiments, the second mask 1302 may be formed by a deposition process (e.g., a PVD process, a CVD process, a PE-CVD process, a LPCVD process, an ion beam deposition, sputtering, or the like).

Figure 14:
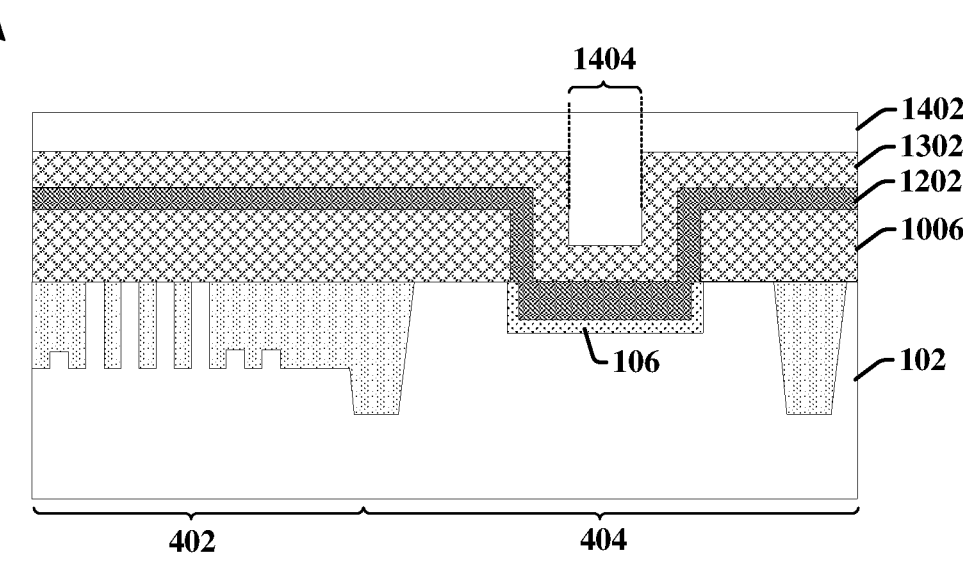

As shown in cross-sectional view 1400 of FIG. 14, an upper dielectric 1402 is formed on the second mask 1302 and within a recess 1404 in the second mask 1302. The upper dielectric 1402 is formed onto sidewalls and a recessed upper surface of the second mask 1302. The upper dielectric 1402 may be formed to continuously extend from within the recess 1404 to over the second mask 1302. In some embodiments, the upper dielectric 1402 may completely fill in the recess 1404. In some embodiments, the upper dielectric 1402 may comprise an oxide (e.g., silicon oxide, silicon rich oxide, or the like). In some embodiments, the upper dielectric 1402 may be formed by a deposition process (e.g., a PVD process, a CVD process, a PE-CVD process, a LPCVD process, an ion beam deposition, sputtering, or the like).

Figure 15:
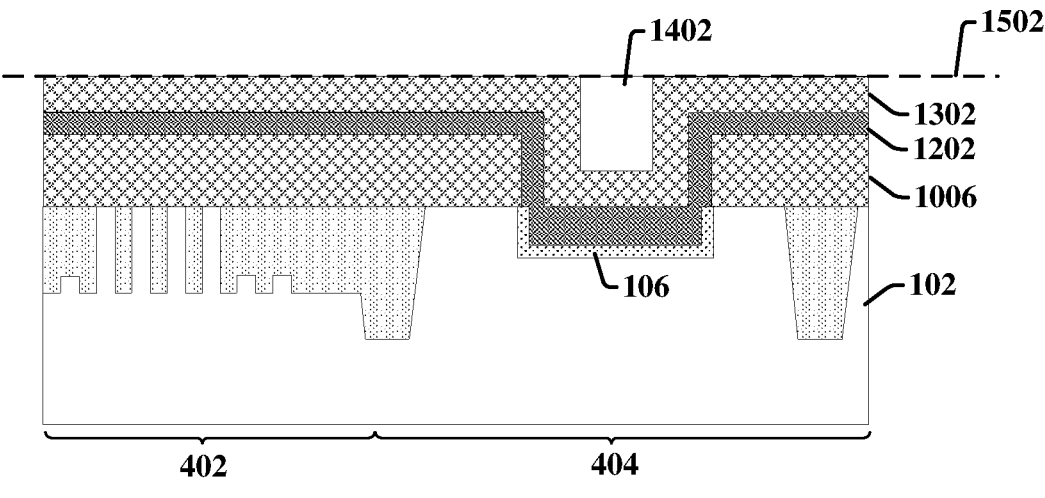

As shown in cross-sectional view 1500 of FIG. 15, a part of the upper dielectric 1402 is removed. Removal of the part of the upper dielectric 1402 exposes a topmost surface of the second mask 1302. In some embodiments, the upper dielectric 1402 may remain between sidewalls of the second mask 1302 after the part of the upper dielectric 1402 is removed. In some embodiments, the part of the upper dielectric 1402 may be removed by a planarization process (e.g., a CMP process, a mechanical grinding process, or the like) performed along line 1502. In other embodiments, the part of the upper dielectric 1402 may be removed by an etching process.

Figure 16:
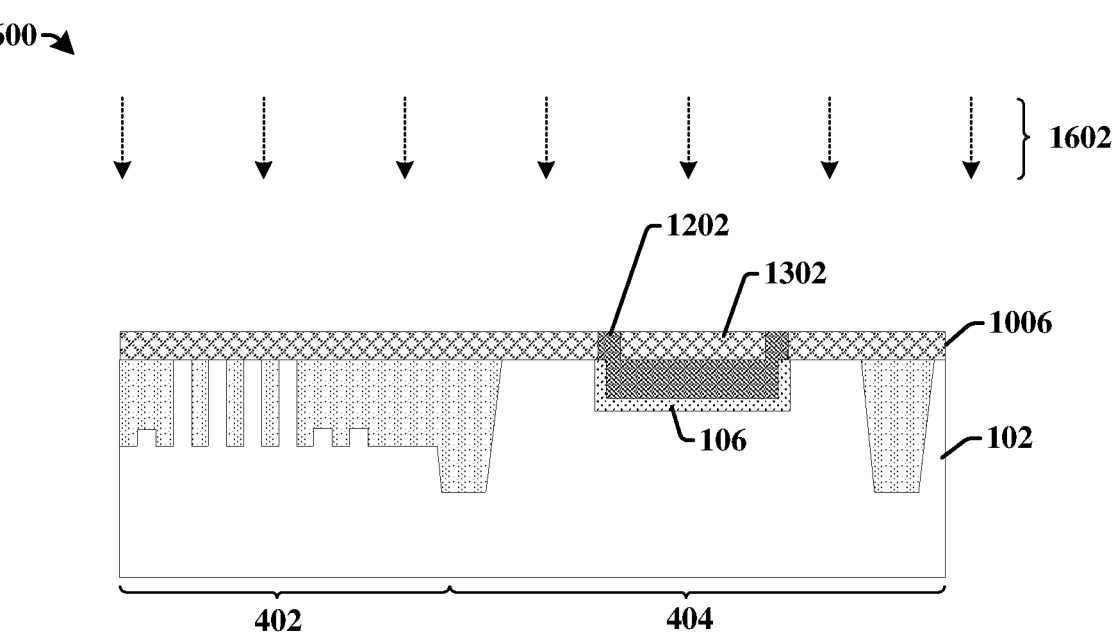

As shown in cross-sectional view 1600 of FIG. 16, a first etching process is performed to remove parts of the second mask 1302 and the second gate dielectric layer 1202. The first etching process exposes the second mask 1302 and the second gate dielectric layer 1202 to an etchant 1602. The etchant 1602 removes parts of the second mask 1302 and the second gate dielectric layer 1202 so as to give the second gate dielectric layer 1202 an uppermost surface that is laterally between the first mask 1006 and the second mask 1302. In some embodiments, the etchant 1602 may be configured to remove the second mask 1302 and the second gate dielectric layer 1202 at substantially equal rates. In some embodiments, the etchant 1602 may comprise or be carbon tetrafluoride ($CF_4$). For example, the etchant 1602 may be a $CF_4$ based etchant in a reactive ion etching process.

Figure 17:
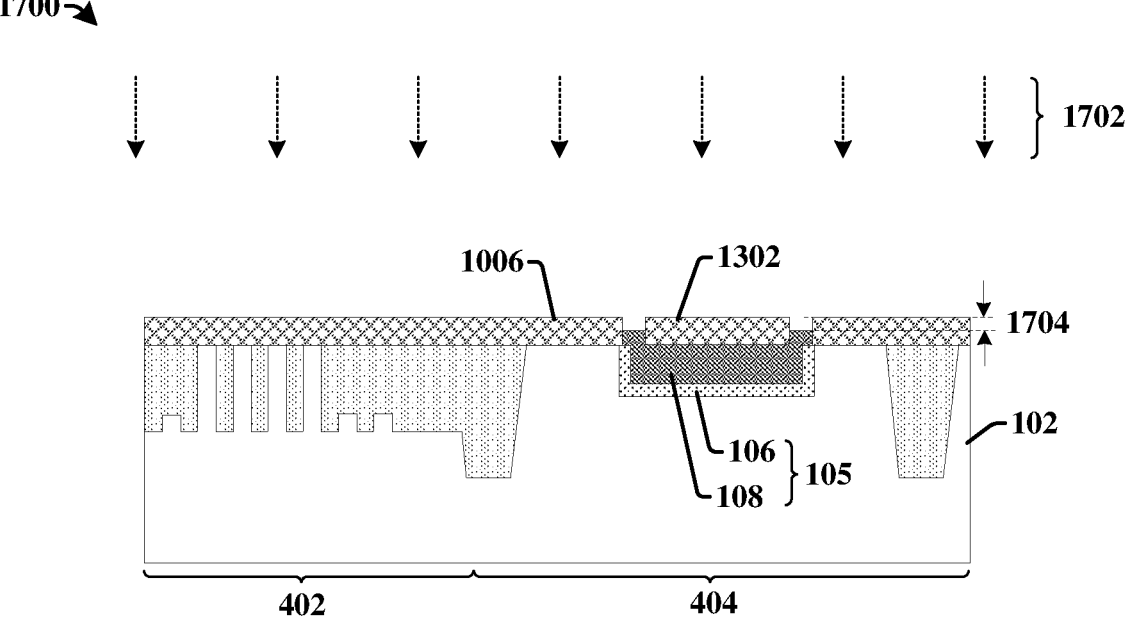

As shown in cross-sectional view 1700 of FIG. 17, a second etching process is performed to recess the second gate dielectric 108 between topmost and bottommost surfaces of the first mask 1006 and the second mask 1302. Recessing the second gate dielectric 108 forms a composite gate dielectric 105 comprising the first gate dielectric 106 and the second gate dielectric 108. In some embodiments, the second etching process exposes the second gate dielectric layer (e.g., 1202 of FIG. 16), the first mask 1006, and the second mask 1302 to an etchant 1702. The etchant 1702 removes parts of the second gate dielectric layer at a faster rate than the first mask 1006 and the second mask 1302, so as to recess the second gate dielectric 108 to a non-zero distance 1704 below the topmost surfaces of the first mask 1006 and the second mask 1302. In some embodiments, the etchant 1702 may comprise or be hydrofluoric acid (HF), ammonia ($NH_3$), and/or the like. In some embodiments, the second etching process has a greater etching selectivity between the second gate dielectric layer (e.g., 1202 of FIG. 16) and the first mask 1006 and/or the second mask 1302 than the first etching process. In some embodiments, the second etching process may utilize advanced process controls (APCs) to improve control (e.g., an etching removal rate, a position of a topmost surface of the second gate dielectric, etc.) of the second etching process.

Figure 18:
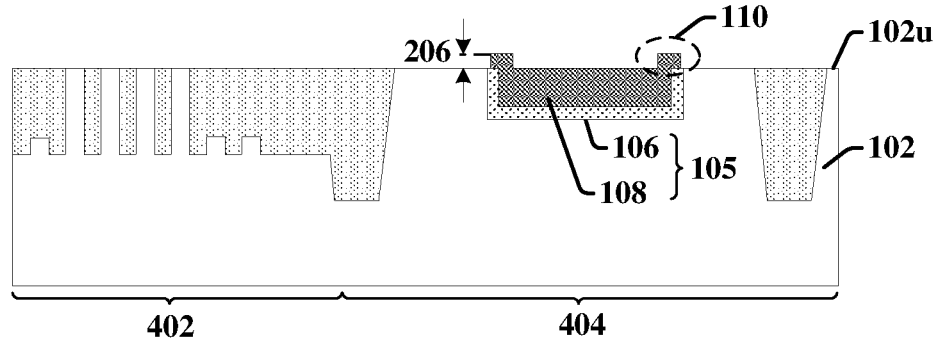

As shown in cross-sectional view 1800 of FIG. 18, the first mask (1006 of FIG. 17) and the second mask (1302 of FIG. 17) are removed. Removing the first mask and the second mask leaves one or more protrusions 110 extending outward from a recessed upper surface of the second gate dielectric 108. The one or more protrusions 110 extend to a first height 206 above the upper surface 102u of the substrate 102.

Figure 19:
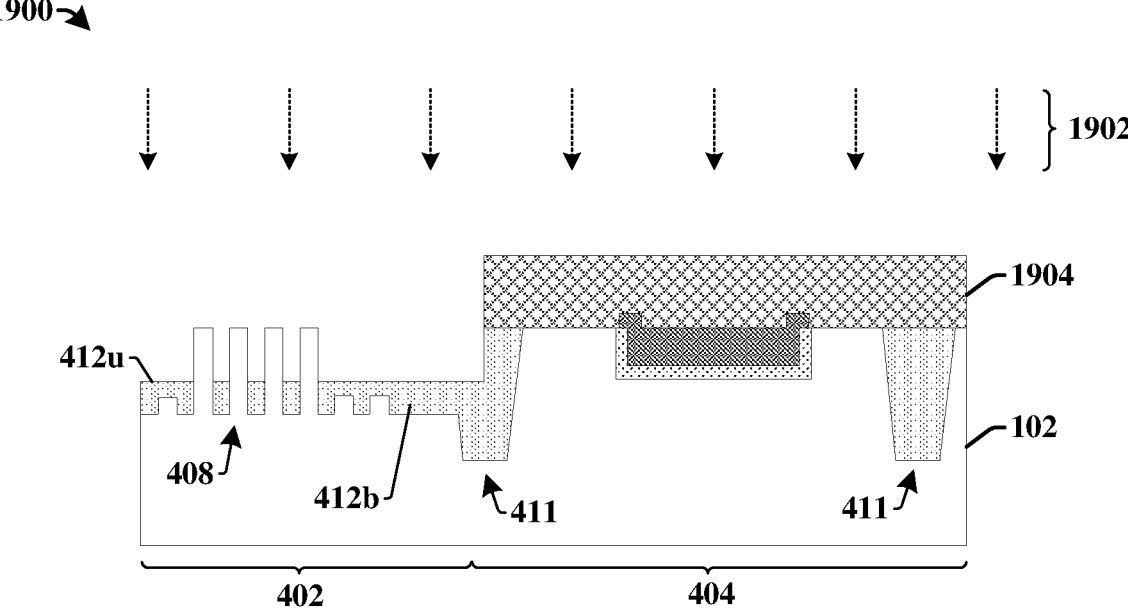

As shown in cross-sectional view 1900 of FIG. 19, the one or more second dielectric materials 412b are recessed within the low-voltage device region 402. Recessing the one or more second dielectric materials 412b exposes upper portions of the one or more fins of semiconductor material 408, so that the one or more fins of semiconductor material 408 protrude outward from a recessed upper surface 412u of the one or more second dielectric materials 412b. In some embodiments, the one or more second dielectric materials 412b are recessed by selectively exposing the one or more second dielectric materials 412b within the low-voltage device region 402 to an etchant 1902 according to a mask 1904 formed over the high-voltage device region 404. The etchant 1902 removes part of the one or more second dielectric materials 412b from within the low-voltage device region 402. In some embodiments, the etchant 1902 may cause one of the one or more isolation structures 411 between the low-voltage device region 402 and the high-voltage device region 404 to have a different shape than the one or more isolation structures 411 within the high-voltage device region 404.

Figure 20:
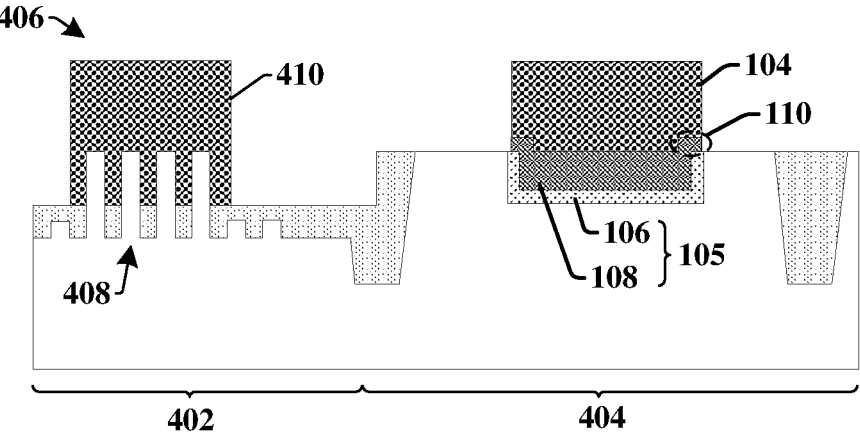

As shown in cross-sectional view 2000 of FIG. 20, a gate electrode 104 is formed over the composite gate dielectric 105 and a low-voltage gate electrode 410 is formed over the plurality of fins of semiconductor material 408. The gate electrode 104 is formed along interior sidewalls and a topmost surface of the second gate dielectric 108. The low-voltage gate electrode 410 is formed to wrap around sidewalls and topmost surfaces of the plurality of fins of semiconductor material 408. A gate dielectric may be formed onto the plurality of fins of semiconductor material 408 prior to forming the low-voltage gate electrode 410.

In some embodiments, the gate electrode 104 and/or the low-voltage gate electrode 410 are formed by depositing a gate electrode material (e.g., polysilicon) over the substrate 102. The gate electrode material is then selectively patterned according to a mask to form the gate electrode 104 and the low-voltage gate electrode 410. In some embodiments, a planarization process (e.g., a CMP process) may be performed on the gate electrode material, so that the gate electrode 104 and/or the low-voltage gate electrode 410 have uppermost surfaces that are substantially co-planar. In other embodiments, the gate electrode 104 and/or the low-voltage gate electrode 410 may be formed by a replacement metal gate process.

Figure 21:
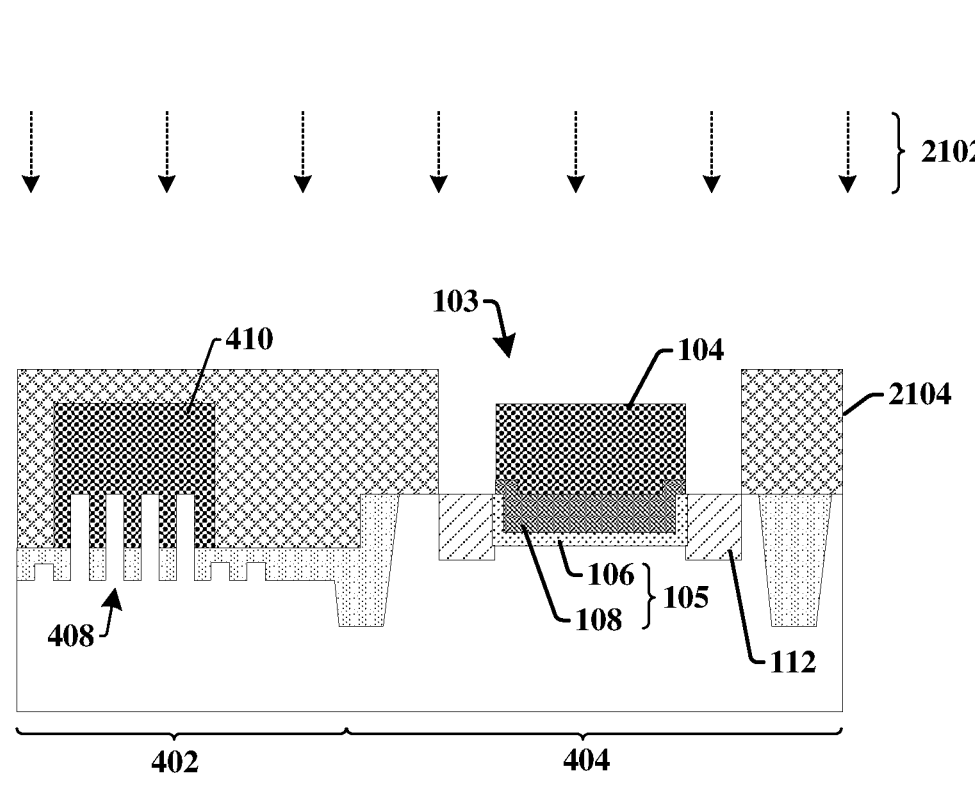

As shown in cross-sectional view 2100 of FIG. 21, source/drain regions 112 are formed within the substrate 102 on opposing sides of the composite gate dielectric 105. In some embodiments, the source/drain regions 112 may comprise highly doped regions (e.g., regions with a doping concentration of greater than $1 \times 10^{18}$ cm$^{-3}$, greater than $1 \times 10^{19}$ cm$^{-3}$, or other similar values) within the substrate 102. In such embodiments, the source/drain regions 112 may be formed by selectively implanting a dopant species 2102 into the substrate 102 according to a mask 2104. The dopant species 2102 may comprise an n-type dopant (e.g., phosphorus, arsenic, antimony, bismuth, or the like) or a p-type dopant (e.g., boron, aluminum, gallium, indium, or the like). In other embodiments, the source/drain regions 112 may comprise highly doped epitaxial regions. In such embodiments, the source/drain regions 112 may be formed by selectively etching the substrate 102 to form source/drain recesses on opposing sides of the composite gate dielectric 105 and subsequently forming a doped epitaxial material within the source/drain recesses.

Figure 22:
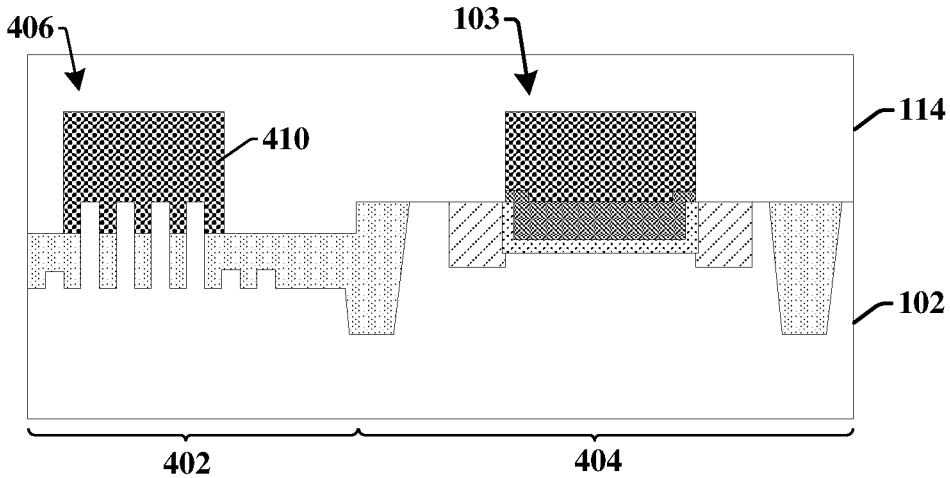

As shown in cross-sectional view 2200 of FIG. 22, a dielectric structure 114 is formed over the substrate 102. In some embodiments, the dielectric structure 114 may comprise an inter-level dielectric (ILD) layer formed by way of a deposition process (e.g., a PVD process, a CVD process, a PE-CVD process, a LPCVD process, an ion beam deposition, sputtering, or the like). The dielectric structure 114 may comprise one or more of silicon dioxide, SiCOH, PSG, BPSG, BSG, FSG, USG, or the like.

Figure 23:
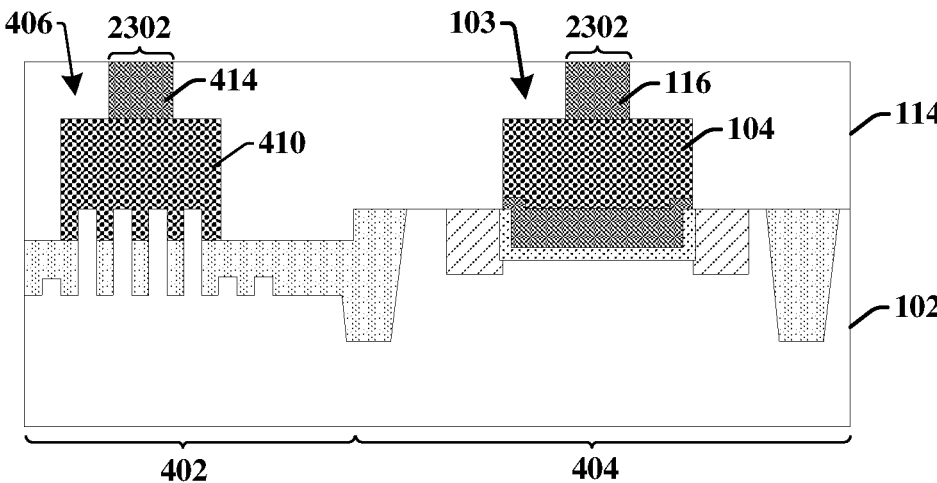

As shown in cross-sectional view 2300 of FIG. 23, an interconnect 116 and an additional interconnect 414 are formed within the dielectric structure 114. The interconnect 116 and the additional interconnect 414 extend through the dielectric structure 114 to respectively contact the gate electrode 104 and the low-voltage gate electrode 410. In some embodiments, the interconnect 116 and the additional interconnect 414 may be formed by selectively patterning the dielectric structure 114 to form interconnect openings 2302 defined by sidewalls of the dielectric structure 114. The interconnect openings 2302 vertically extend from a top of the dielectric structure 114 to expose the gate electrode 104 and the low-voltage gate electrode 410. The interconnect 116 and the additional interconnect 414 are formed within the interconnect openings 2302. In some embodiments, the interconnect 116 and the additional interconnect 414 may be formed by filling the interconnect openings 2302 with a conductive material (e.g., tungsten, ruthenium, copper, and/or aluminum) and subsequently performing a planarization process (e.g., a chemical mechanical planarization process) to remove an excess of the conductive material from over the dielectric structure 114.

FIG. 24 illustrates a flow diagram of some embodiments of a method 2400 of forming an integrated having a low-voltage device and a high-voltage transistor device comprising a composite gate dielectric.

While method 2400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2402, a substrate is provided with a low-voltage device region and a high-voltage device region. FIG. 6 illustrates a cross-sectional view 600 of some embodiments corresponding to act 2402.

At act 2404, a plurality of fins of semiconductor material are formed to protrude outward from a depressed upper surface of the substrate within the low-voltage device region. FIG. 8 illustrates a cross-sectional view 800 of some embodiments corresponding to act 2404.

At act 2406, a recess is formed within the substrate in the high-voltage device region according to a first mask. FIG. 10 illustrates a cross-sectional view 1000 of some embodiments corresponding to act 2406.

At act 2408, a first gate dielectric is formed on one or more interior surfaces of the substrate forming the recess. FIG. 11 illustrates a cross-sectional view 1100 of some embodiments corresponding to act 2408.

Figure 12:
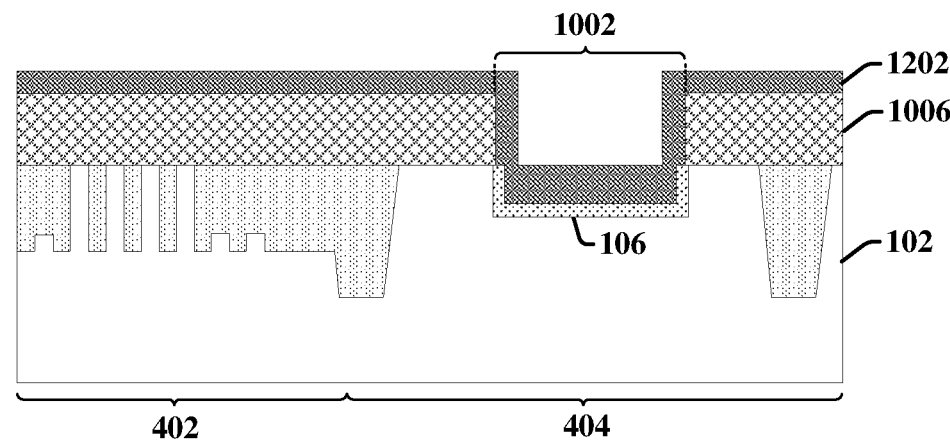

At act 2410, a second gate dielectric layer is formed within the recess and over the first mask. FIG. 12 illustrates a cross-sectional view 1200 of some embodiments corresponding to act 2410.

At act 2412, a second mask is formed over and along sidewalls of second gate dielectric layer. FIG. 13 illustrates a cross-sectional view 1300 of some embodiments corresponding to act 2412.

At act 2414, a first etching process is performed to remove parts of the second mask and to expose upper surfaces of the second gate dielectric layer between the first mask and the second mask. FIG. 16 illustrates a cross-sectional view 1600 of some embodiments corresponding to act 2414.

At act 2416, a second etching process is performed to recess the second gate dielectric below topmost surfaces of the first mask and the second mask. FIG. 17 illustrates a cross-sectional view 1700 of some embodiments corresponding to act 2416.

At act 2418, the first mask and the second mask are removed to leave one or more protrusions extending outward from a recessed upper surface of a composite gate dielectric comprising the first gate dielectric and the second gate dielectric. FIG. 18 illustrates a cross-sectional view 1800 of some embodiments corresponding to act 2418.

At act 2420, a gate electrode is formed over the composite gate dielectric and a low-voltage gate electrode is formed over the plurality of fins of semiconductor material. FIG. 20 illustrates a cross-sectional view 2000 of some embodiments corresponding to act 2420.

Accordingly, in some embodiments, the present disclosure relates to an integrated chip having a composite gate dielectric with one or more protrusions that are arranged in a peripheral region of the composite gate dielectric to mitigate thinning of the composite gate dielectric.

In some embodiments, the present disclosure relates to an integrated chip. The integrated chip includes a substrate having one or more interior surfaces forming a recess within an upper surface of the substrate; source/drain regions disposed within the substrate on opposing sides of the recess; a first gate dielectric arranged along the one or more interior surfaces forming the recess; a second gate dielectric arranged on the first gate dielectric and within the recess; a gate electrode disposed on the second gate dielectric; and the second gate dielectric including one or more protrusions that extend outward from a recessed upper surface of the second gate dielectric and that are arranged along opposing sides of the second gate dielectric. In some embodiments, the second gate dielectric covers a topmost surface of the first gate dielectric. In some embodiments, the first gate dielectric is a thermal oxide and the second gate dielectric is a high temperature oxide. In some embodiments, the second gate dielectric is arranged along an interior sidewall and a topmost surface of the first gate dielectric. In some embodiments, the second gate dielectric has a recess within a topmost surface of the second gate dielectric, the gate electrode extending from within the recess to over the topmost surface of the second gate dielectric. In some embodiments, the one or more protrusions are formed by an interior sidewall of the second gate dielectric that is directly over the second gate dielectric. In some embodiments, the one or more protrusions have a height that is in a range of between approximately 4 nanometers (nm) and approximately 6 nm. In some embodiments, the integrated chip further includes a dielectric structure laterally surrounding one or more fins of semiconductor material extending outward from a depressed upper surface of the substrate, a topmost surface of the second gate dielectric being vertically above a topmost surface of the one or more fins of semiconductor material; and a low-voltage gate electrode disposed over the one or more fins of semiconductor material. In some embodiments, the gate electrode and the low-voltage gate electrode have uppermost surfaces that are substantially co-planar.

In other embodiments, the present disclosure relates to an integrated chip. The integrated chip includes a substrate; a composite gate dielectric lining a recessed upper surface and interior sidewalls of the substrate, the composite gate dielectric having a first gate dielectric and a second gate dielectric on the first gate dielectric; source/drain regions disposed within the substrate on opposing sides of the composite gate dielectric; a gate electrode disposed on the composite gate dielectric; and the composite gate dielectric including a central region and one or more peripheral regions surrounding the central region, the second gate dielectric having one or more protrusions that extend outward from an upper surface of the second gate dielectric within the one or more peripheral regions. In some embodiments, the second gate dielectric has a topmost surface that laterally extends from directly over a topmost surface of the first gate dielectric to directly over a recessed upper surface of the first gate dielectric. In some embodiments, the second gate dielectric has a topmost surface that is arranged along outermost sidewalls of the second gate dielectric. In some embodiments, an imaginary horizontal line that is parallel to an upper surface of the substrate extends through interior sidewalls of the second gate dielectric and sidewalls of the gate electrode. In some embodiments, the second gate dielectric has a maximum thickness at a location that is laterally between an outermost sidewall of the second gate dielectric and an interior sidewall of the second gate dielectric that faces the gate electrode.

In yet other embodiments, the present disclosure relates to a method of forming an integrated chip. The method includes forming a recess within a substrate according to a first mask; forming a first gate dielectric within the recess; forming a second gate dielectric layer on the first gate dielectric, the second gate dielectric layer continuously extending from below the first mask to over the first mask; forming a second mask on the second gate dielectric layer, the second mask continuously extending from below a top of the second gate dielectric layer to over the top of the second gate dielectric layer; performing a first etching process to expose one or more upper surfaces of the second gate dielectric layer that are between the first mask and the second mask; performing a second etching process to recess the second gate dielectric layer and to form a second gate dielectric that has a topmost surface between topmost and bottommost surfaces of the first mask and the second mask; and forming a gate electrode over the second gate dielectric after removing the first mask and the second mask. In some embodiments, recessing the second gate dielectric layer forms one or more protrusions extending outward from a recessed upper surface of the second gate dielectric. In some embodiments, the method further includes forming an upper dielectric onto the topmost surface of the second mask and within a recess in the topmost surface of the second mask; and performing a planarization process to remove a part of the upper dielectric and to expose the second mask. In some embodiments, the first mask and the second mask are silicon nitride. In some embodiments, the second etching process has a greater etching selectivity between the first mask and the second gate dielectric layer than the first etching process. In some embodiments, the first gate dielectric is formed using a thermal oxidation process; and the second gate dielectric layer is formed using a vapor deposition technique performed at a temperature of greater than approximately 400° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
forming a recess within a substrate according to a first mask;
forming a first gate dielectric within the recess;
forming a second gate dielectric layer on the first gate dielectric, the second gate dielectric layer continuously extending from below the first mask to over the first mask;
forming a second mask on the second gate dielectric layer, the second mask continuously extending from below a top of the second gate dielectric layer to over the top of the second gate dielectric layer;
performing a first etching process to expose one or more upper surfaces of the second gate dielectric layer that are between the first mask and the second mask;
performing a second etching process to recess the second gate dielectric layer and to form a second gate dielectric that has a topmost surface between topmost and bottommost surfaces of the first mask and the second mask; and
forming a gate electrode over the second gate dielectric after removing the first mask and the second mask.

2. The method of claim 1, wherein recessing the second gate dielectric layer forms one or more protrusions extending outward from a recessed upper surface of the second gate dielectric.

3. The method of claim 1, further comprising:
forming an upper dielectric onto the topmost surface of the second mask and within a recess in the topmost surface of the second mask; and
performing a planarization process to remove a part of the upper dielectric and to expose the second mask.

4. The method of claim 1, wherein the first mask and the second mask are silicon nitride.

5. The method of claim 1, wherein the second etching process has a greater etching selectivity between the first mask and the second gate dielectric layer than the first etching process.

6. The method of claim 1,
wherein the first gate dielectric is formed using a thermal oxidation process; and
wherein the second gate dielectric layer is formed using a vapor deposition technique performed at a temperature of greater than approximately 400° C.

7. A method of forming an integrated chip, comprising:
etching a substrate to form a recess within the substrate;
performing an oxidation process to form a first gate dielectric along an upper surface and sidewalls of the substrate that form the recess;
depositing a second gate dielectric along an upper surface and interior sidewalls of the first gate dielectric, wherein the second gate dielectric has a larger thickness at a lateral center of the second gate dielectric than along an outermost sidewall of the second gate dielectric, and wherein the second gate dielectric has a central region surrounded by a peripheral region, the central region being recessed below the peripheral region; and depositing a gate electrode material over the central region and the peripheral region of the second gate dielectric.

8. The method of claim 7, wherein the second gate dielectric is formed by a deposition process that is performed at a temperature of greater than approximately 500° C.

9. The method of claim 7,
wherein both the central region and the peripheral region of the second gate dielectric are completely laterally confined within a footprint of the recess; and
wherein the second gate dielectric vertically extends outward from the recess to above the substrate.

10. The method of claim 7, wherein the interior sidewalls of the first gate dielectric continuously extend between a lower surface and the upper surface of the first gate dielectric to form a recess in the upper surface of the first gate dielectric, the second gate dielectric being deposited to fill the recess.

11. The method of claim 7, further comprising:
depositing a sacrificial layer over the substrate;
patterning the sacrificial layer to form an opening extending through the sacrificial layer;
exposing the substrate to an etchant according to the opening to form the recess; and
depositing the second gate dielectric along sidewalls and over an upper surface of the sacrificial layer.

12. The method of claim 11, further comprising:
performing a chemical mechanical polishing (CMP) process to remove a part of the second gate dielectric that is over the sacrificial layer;
performing an etching process to recess the second gate dielectric after performing the CMP process; and
removing the sacrificial layer after performing the etching process.

13. The method of claim 11, further comprising:
etching the substrate to form a plurality of fins protruding outward from an additional upper surface of the substrate;
forming a dielectric material along sidewalls of the plurality of fins; and
depositing the sacrificial layer to cover the plurality of fins and the dielectric material.

14. The method of claim 13, further comprising:
recessing the dielectric material after removing the sacrificial layer; and
depositing the gate electrode material over and along the sidewalls of the plurality of fins.

15. The method of claim 14, wherein the gate electrode material is concurrently deposited over the central region and the peripheral region of the second gate dielectric and over and along the sidewalls of the plurality of fins.

16. The method of claim 7, wherein the central region of the second gate dielectric is vertically at or above a topmost surface of the first gate dielectric.

17. A method of forming an integrated chip, comprising:
etching a substrate according to a first sacrificial mask to form a recess within the substrate;
performing an oxidation process to form a first gate dielectric along an upper surface and sidewalls of the substrate that form the recess;
depositing a second gate dielectric along a top surface and interior sidewalls of both the first gate dielectric and the first sacrificial mask;
depositing a second sacrificial mask along a top surface and interior sidewalls of the second gate dielectric;

removing upper portions of the second gate dielectric and the second sacrificial mask to expose upper surfaces of the second gate dielectric that are laterally between the first sacrificial mask and the second sacrificial mask;

etching the upper surfaces of the second gate dielectric to recess the second gate dielectric below tops of the first sacrificial mask and the second sacrificial mask;

removing the first sacrificial mask and the second sacrificial mask; and depositing a gate electrode material over the second gate dielectric.

18. The method of claim 17, wherein the first sacrificial mask and the second sacrificial mask comprise a dielectric material.

19. The method of claim 17, wherein the second gate dielectric vertically separates a topmost surface of the first gate dielectric from the gate electrode material.

20. The method of claim 17, wherein the second gate dielectric comprises protrusions extending outward from the second gate dielectric, the protrusions having a curved surface.

\* \* \* \* \*